US009092219B2

(12) United States Patent
Naffziger et al.

(10) Patent No.: US 9,092,219 B2
(45) Date of Patent: Jul. 28, 2015

(54) METHOD AND SYSTEM OF SAMPLING TO AUTOMATICALLY SCALE DIGITAL POWER ESTIMATES WITH FREQUENCY

(75) Inventors: Samuel D. Naffziger, Fort Collins, CO (US); Suresh B. Periyacheri, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 1304 days.

(21) Appl. No.: 12/917,928

(22) Filed: Nov. 2, 2010

(65) Prior Publication Data
US 2012/0109550 A1 May 3, 2012

(51) Int. Cl.
*G06F 1/32* (2006.01)
*G01R 31/317* (2006.01)

(52) U.S. Cl.
CPC ........ *G06F 1/3206* (2013.01); *G01R 31/31721* (2013.01); *G06F 1/3203* (2013.01); *G06F 1/3234* (2013.01); *Y02B 60/10* (2013.01); *Y02B 60/12* (2013.01); *Y02B 60/1217* (2013.01)

(58) Field of Classification Search
CPC ..... G06F 1/3206; G06F 19/00; G06F 1/3203; G06F 11/3058; G01R 21/00; G01F 1/3234; G01F 1/3293; Y02B 60/10; Y02B 60/12; Y02B 60/1203; Y02B 60/1207; Y02B 60/121; Y02B 60/1214
See application file for complete search history.

(56) References Cited

U.S. PATENT DOCUMENTS

| 6,564,328 | B1 | 5/2003 | Grochowski | |
|---|---|---|---|---|
| 6,976,178 | B1* | 12/2005 | Kissell | 713/300 |
| 7,770,034 | B2 | 8/2010 | Nanja | |
| 8,010,824 | B2* | 8/2011 | Naffziger | 713/340 |
| 8,060,765 | B1* | 11/2011 | Cha et al. | 713/322 |
| 8,442,786 | B2* | 5/2013 | Naffziger et al. | 702/62 |
| 8,484,593 | B2* | 7/2013 | Lepak et al. | 716/109 |

OTHER PUBLICATIONS

U.S. Appl. No. 12/917,947 entitled "Method and System for Varying Sampling Frequency to Avoid Software Harmonics When Sampling Digital Power Indicators" filed Nov. 2, 2010.

* cited by examiner

*Primary Examiner* — Janet Suglo
*Assistant Examiner* — L. Anderson
(74) *Attorney, Agent, or Firm* — Meyertons Hood Kivlin Kowert & Goetzel (57) ABSTRACT

A method for automatically scaling estimates of digital power consumed by a portion of an integrated circuit (IC) device by the operating frequency of the portion of the IC are described herein. The method may include obtaining an energy value which may correspond to an amount of energy used by the portion of the IC. A cumulative energy value may be generated by repeatedly, at a frequency proportional to the operating frequency of the portion of the IC, obtaining energy values and adding each obtained energy value to a sum of energy values for the portion of the IC. The cumulative energy value may be sampled at a time sample interval to generate an estimate of the portion of the IC's digital power consumption that is automatically scaled with the operating frequency of the portion of the IC.

20 Claims, 4 Drawing Sheets

METHOD AND SYSTEM OF SAMPLING TO AUTOMATICALLY SCALE DIGITAL POWER ESTIMATES WITH FREQUENCY

BACKGROUND

1. Technical Field

This disclosure relates to power usage estimation and, more particularly, to power usage estimation in a processor using digital techniques.

2. Description of the Related Art

Many modern processors are capable of consuming a great deal of power and in so doing may generate a significant amount of heat. If left unchecked, this heat could cause catastrophic damage to the processor. Thus, power management systems have been developed to limit the power the processor consumes and thus the heat generated. In many power management systems, the thermal design power (TDP) for the entire integrated circuit (IC) device is commonly the primary metric that is used to control power consumption by the IC and to ensure that thermal limits of the IC are not exceeded. Typically, if the thermal limits are being reached, or the thermal power reaches a particular threshold, the power management system may throttle the IC by reducing performance. Conversely, if power consumption can be accurately measured while running a given application, and the power used is less than the TDP capability of the platform, performance may be increased by allowing the IC to consume the available headroom in the TDP by increasing the operating voltage, the operating frequency or both.

However, the capabilities of conventional thermal measurement mechanisms have less than acceptable granularity and repeatability in many cases. Furthermore, conventional thermal measurement mechanisms may not consider the dependence of power consumption on frequency. Conventional thermal management mechanisms that may consider a dependence on frequency typically require complex mathematical computations which must be supported by a microcontroller or other complex circuitry and may be computationally expensive.

SUMMARY OF EMBODIMENTS

Various embodiments of a method and system for automatically scaling estimates of digital power consumed by a portion of an integrated circuit device by the operating frequency of the portion of the integrated circuit device are disclosed. Broadly speaking, estimating power on an integrated circuit device using digital techniques may require granularity and precision. Accordingly, power monitors have been developed that may monitor a set of signals in the integrated circuit device for specific activity. Each such signal may correlate to an amount of power consumed by at least a portion of the integrated circuit device.

In one embodiment, the method may include obtaining an energy value for the portion of the integrated circuit device. As an example, the power monitor may obtain the energy value by monitoring the set of signals. The energy value may correspond to an amount of energy used by the portion of the integrated circuit device. The method may also include generating a cumulative energy value for the portion of the integrated circuit device. Generating the cumulative energy value may include repeatedly obtaining energy values for the portion of the integrated circuit device and adding each obtained energy value to a sum of energy values. The sum of energy values may be the cumulative energy value. As an example, the rate at which the energy values are obtained (e.g., sampled) may be proportional to the operating frequency of the portion of the integrated circuit device. The method may also include sampling the cumulative energy value at a fixed time sample interval. Each sample of the cumulative energy value may be an estimate of an amount of energy used by the portion of the integrated circuit device during the fixed time sample interval.

In one specific implementation, an estimated amount of power consumed by the portion of the integrated circuit device may be calculated by dividing a sample of the cumulative energy value by the fixed time sample interval. In such an implementation, power consumption may be defined as energy per unit time. Sampling the cumulative energy value at a fixed time sample interval may automatically scale a power consumption estimate for the portion of the integrated circuit device by the operating frequency of the portion of the integrated circuit device.

In another embodiment, the system may include a plurality of processor cores. Each one of the plurality of processor cores may include a respective power monitor. Each power monitor may be configured to obtain an energy value for a respective processor core. The energy value may correspond to an amount of energy used by the processor core during operation. The power monitor may be further configured to generate a cumulative energy value for the processor core by repeating, at a sampling frequency, obtaining the energy value and adding each obtained energy value to a sum of energy values. The sum of the energy values may correspond to the cumulative energy value. The system may also include a power management unit coupled to the plurality of processor cores. The power management unit may be configured to sample the cumulative energy value at a fixed time sample interval. Each sample of the cumulative energy value may correspond to an estimate of an amount of energy used by the processor core during the fixed time sample interval.

Specific embodiments are shown by way of example in the drawings and will herein be described in detail. It should be understood, however, that the drawings and detailed description are not intended to limit the claims to the particular embodiments disclosed, even where only a single embodiment is described with respect to a particular feature. On the contrary, the intention is to cover all modifications, equivalents and alternatives that would be apparent to a person skilled in the art having the benefit of this disclosure. Examples of features provided in the disclosure are intended to be illustrative rather than restrictive unless stated otherwise.

As used throughout this application, the word "may" is used in a permissive sense (i.e., meaning having the potential to), rather than the mandatory sense (i.e., meaning must).

Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six, interpretation for that unit/circuit/component.

DETAILED DESCRIPTION OF EMBODIMENTS

Figure 1:
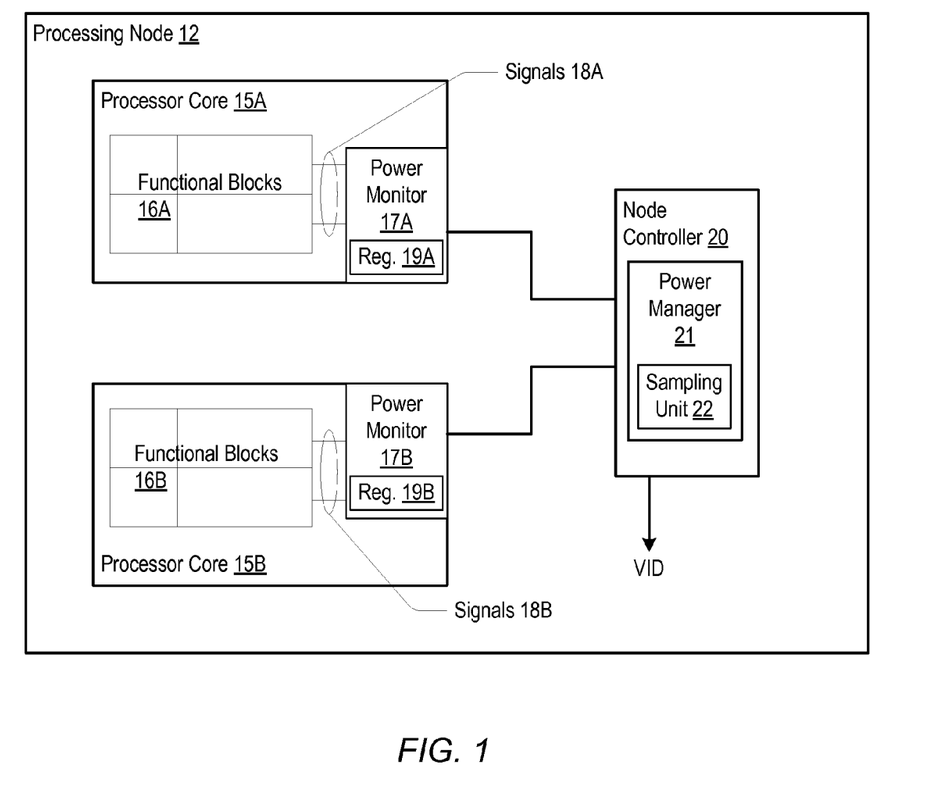
FIG. 1 is a block diagram of one embodiment of a processing node having processor cores with digital power monitors.

Turning now to FIG. 1, a simplified block diagram of one embodiment of a processing node is shown. In the illustrated embodiment, the processing node 12 includes processor cores 15A-15B coupled to a node controller 20. In one embodiment, node 12 may be a single integrated circuit chip comprising the circuitry shown therein in FIG. 1. That is, node 12 may be a chip multiprocessor (CMP). Other embodiments may implement the node 12 as two or more separate integrated circuits, as desired. Any level of integration or discrete components may be used. It is noted that components having a number and a letter as a reference designator may be referred to by the number only where appropriate. It is also noted that processor cores 15A-15B may be any type of processing element and may not be identical nor even similar to each other. For example, processor core 15A or 15B may a central processing unit (CPU) core, graphics processing unit (GPU) core, digital signal processing (DSP) core, application processor (AP) core or any other core. Additionally, processor cores 15A and 15B may be any combinations thereof.

It is also noted that, a processing node such as node 12 may include any number of processor cores, in various embodiments. It is further noted that processor node 12 may include many other components that have been omitted here for simplicity. For example, in various embodiments processing node 12 may include an integral memory controller and various communication interfaces for communicating with other nodes, and I/O devices.

In one embodiment, node controller 20 may include various interconnection circuits (not shown) for interconnecting processor cores 15A and 15B to each other, to other nodes, and to a system memory (not shown). As shown, the node controller 20 includes a power manager 21 that may be configured to control the amount of power consumed by each processor core 15 and therefore, the amount of heat generated. The power manager 21 may be configured to control the operating frequency for each core and/or the power supply voltages for the node using the voltage identifier (VID) signals provided to the voltage regulator(s). In one embodiment, the maximum and minimum operating frequencies for the node and the maximum and minimum power supply voltages for the node may be provided via fuses that are blown during manufacture. In addition, as described further below, the power manager 21 may be configured to control the power consumed by each core based upon power estimates provided by the power monitors 17A and 17B within each of processor cores 15A and 15B, respectively. Sampling unit 22 of power manager 21 may be configured to periodically sample the power consumed by processor cores 15A and 15B.

Generally, a processor core (e.g., 15A-15B) may include circuitry that is designed to execute instructions defined in a given instruction set architecture. That is, the processor core circuitry may be configured to fetch, decode, execute, and store results of the instructions defined in the instruction set architecture. For example, in one embodiment, processor cores 15A-15B may implement the x86 architecture. The processor cores 15A-15B may comprise any desired configurations, including superpipelined, superscalar, or combinations thereof. Other configurations may include scalar, pipelined, non-pipelined, etc. Various embodiments may employ out of order speculative execution or in order execution. The processor core may include microcoding for one or more instructions or other functions, in combination with any of the above constructions. Various embodiments may implement a variety of other design features such as caches (e.g., L1 and L2 caches), TLBs, etc. These various design features and microarchitectural blocks described above are represented in FIG. 1 as functional blocks 16A and 16B of processor cores 15A and 15B, respectively.

In the illustrated embodiment, processor core 15A includes a power monitor 17A, which includes one or more storages (e.g., reg. 19A), for example. Likewise, processor core 15B includes a power monitor 17B, which also includes one or more storages (e.g., reg. 19B), for example. As described further below, each power monitor 17 may be configured to monitor energy values for multiple signals within a corresponding processor core 15. More particularly, in one embodiment, each power monitor 17 may be configured to monitor the activity factor or level of multiple, predetermined signals within a corresponding core. The power monitor 17 may be configured to, for each signal, multiply the activity factor for the signal by a weight factor for the signal to determine an energy value for the signal. Each power monitor 17 may sum the resulting energy values for the monitored signals to obtain a cumulative energy value for a corresponding core 15. The cumulative energy value for a core 15 may be an estimate of the amount of energy used by the core 15.

As will be described in greater detail below in conjunction with the description of FIG. 2 and FIG. 3, in various embodiments, sampling unit 22 of power manager 21 may be configured to sample the cumulative energy value for the core at a fixed time sample interval. Each sample of the cumulative energy value may be an estimate of an amount of energy used by the portion of the integrated circuit device during the fixed time sample interval. Since power consumption may be defined as energy per unit time, sampling the cumulative energy value at a fixed time sample interval may automatically scale a power consumption estimate for the portion of the integrated circuit device by the operating frequency of the portion of the integrated circuit device. Additionally, sampling unit 22 of power manager 21 may sample, at a same fixed time sample interval, the cumulative energy values for each core 15 in processing node 12. As described in further detail below, power manager 21 may calculate, dependent on the sampled cumulative energy values, power consumption estimates for the cores 15 in processing node 12 and may sum the power consumption estimates to calculate a dynamic power consumption value for the processing node 12. In other embodiments, the power monitors 17 may be configured to, at a same fixed time sample interval, provide cumulative energy values for corresponding cores 15 to the power manager 21. In response to the core energy values (either sampled by power manager 21, or received from the power monitors 17), the power manager 21 may increase or decrease the frequency of one or more cores, increase or decrease the operating voltages of the cores, or otherwise control the operational state of the cores in an effort to optimize performance while staying within the thermal budget of the processing node 12.

The total power consumed by processing node 12 may be determined by considering both the amount of leakage current for various components within processing node 12 and the amount of switching activity for various components within processing node 12. An amount of switching activity for a component within processing node 12 may directly correlate to an amount of power being consumed by the component. As a result, switching activity of a component may be measured to determine the dynamic power consumption for the component. Dynamic power consumption for a component in processing node 12 may be dependent on the operating frequency of the component. Accordingly, to obtain an accurate estimate of dynamic power consumed by processing node 12, the dynamic power measurements for components of processing node 12 may be scaled by the operating frequency of the components.

As described above, power monitor 17 may generate a cumulative energy value for a core 15 which may represent an amount of energy consumed by the core 15. The cumulative energy value for a core 15 may represented by equation 1.

$$E = CV^2 \qquad (1)$$

In equation 1, variable, C, may represent the total circuit capacitance switched and variable, V, may represent the operating voltage for core 15. Sampling unit 22 of power monitor 21 may sample the cumulative energy value, E, at a fixed time sample interval. During the fixed time sample interval, the number of times that capacitance, C, is switched may be directly proportional to the operating frequency of the core 15 during the fixed time sample interval. Accordingly, the magnitude of C in equation 1 may be directly proportional to the operating frequency of the core 15 during the fixed time sample interval. As an example, for higher operating frequencies of core 15, capacitance C will be switched more times, and, as a result, will have a higher magnitude. As another example, for lower operating frequencies of core 15, capacitance C will be switched fewer times, and, as a result, will have a lower magnitude.

Power manager 21 may calculate a dynamic power consumption value for a core 15 dependent on the cumulative energy value E. To calculate the dynamic power consumption for a core 15, power manager 21 may divide the cumulative energy value C by an amount of time which is equivalent to the fixed time sample interval. For example, power manager 21 may use equation 2 to calculate the dynamic power consumption value for a core 15:

$$P = E/s \qquad (2)$$

where s represents the length of the fixed time sample interval. Accordingly, the dynamic power consumption calculated by power manager 21 may automatically be scaled by the operating frequency of core 15.

Figure 2:
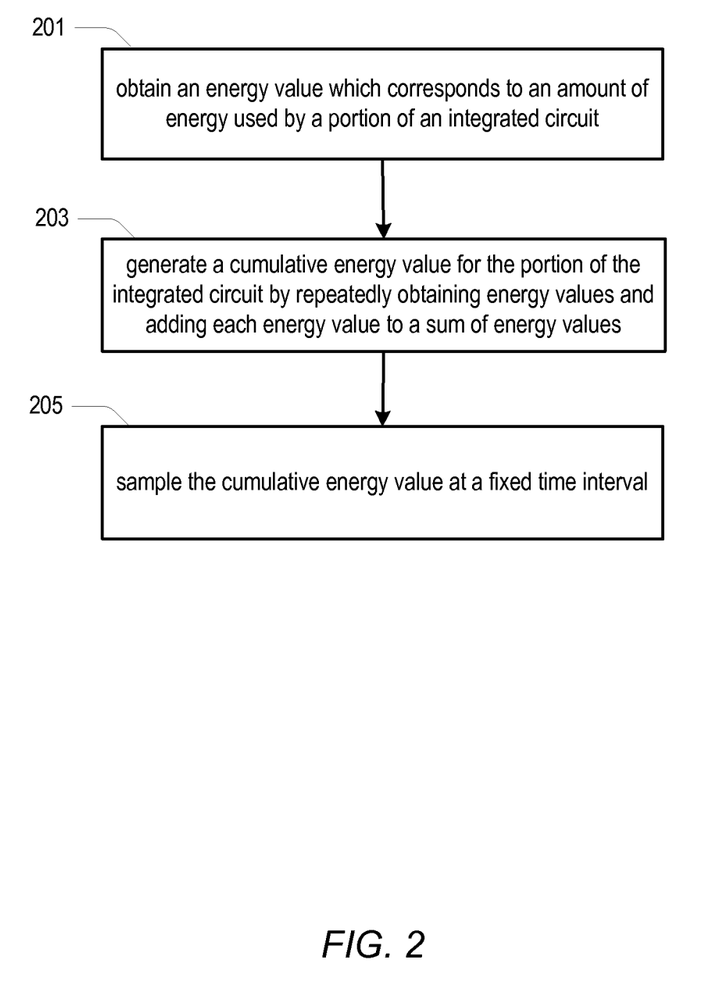
FIG. 2 is a flow diagram depicting one embodiment of a method for sampling energy values at a fixed time sample interval to automatically scale digital power estimates with frequency.

FIG. 2 is a flow diagram describing a method for sampling energy values at a fixed time sample interval to automatically scale digital power estimates with operating frequency. Referring collectively to FIG. 1 and FIG. 2, and beginning in block 201 of FIG. 2, an energy value that corresponds to an amount of energy used by a portion of an integrated circuit may be obtained. For example, a power monitor 17 may monitor a set of signals of a corresponding core 15 to determine an activity level for each signal. The activity level for a signal may represent dynamic activity, or switching activity, of the core 15. Using the activity level for each signal and a respective weight for each signal, power monitor 17 may calculate an energy value for core 15. As an example, power monitor 17 may store the calculated energy value in a storage location within core 15, such as in register 19.

A cumulative energy value for the portion of the integrated circuit may be generated by repeatedly obtaining energy values for the portion of the integrated circuit and adding each energy value to a sum of energy values (block 203). For example, power monitor 17 may repeatedly execute the method described above (block 201) to obtain multiple energy values for a corresponding core 15. Power monitor 17 may repeatedly obtain energy values for core 15 at a particular sampling frequency. The particular sampling frequency may be proportional to the operating frequency of the core 15. As an example, power monitor 17 may obtain an energy value for the core 15 during each operating clock cycle of core 15. As another example, power monitor 17 may obtain an energy value for the core 15 during every eight operating clock cycles of core 15.

As described above, power monitor 17 may store an obtained energy value, for example, in register 19. Power monitor 17 may generate the cumulative energy value by adding each successively obtained energy value to the value stored in register 19. Accordingly, a store location such as register 19 may store a value which represents a cumulative energy value, obtained over a period of time, for a core 15. As described above, power monitor 17 may obtain energy values at a sampling rate which is proportional to the operating frequency of the core. Accordingly, the number of energy values summed in register 19 may be proportional to the operating frequency of core 15. As a result, the cumulative energy value may be proportional to the operating frequency of core 15. More specifically, for higher core operating frequencies, more energy values may be added to register 19 over a period of time, which may result in a higher cumulative energy value. For lower core operating frequencies, fewer energy values may be added to register 19 over the same period of time, which may result in a lower cumulative energy value.

As shown at block 205 of FIG. 2, the cumulative energy value may be sampled at a fixed time sample interval. For example, power manager 21 may retrieve the cumulative energy value for a core 15 from a corresponding power monitor 17. More specifically, power manager 21 may sample the cumulative energy value for a core 15 by reading the value of register 19 at fixed time sample intervals. Power manager 21 may sample the cumulative energy values for each core (e.g., cores 15A and 15B) within a processing node 21 at a same fixed time sample interval. After sampling the cumulative energy value for a core, power manager 21 may reset the cumulative energy value of the core, or may direct power monitor 17, or some other entity of core 15 to reset the cumulative energy value. For example, power manager 21 may reset the cumulative energy value by setting the value of register 19 to zero, or by instructing power monitor 17 to set the value of register 19 to zero. A cumulative energy value sampled by power manager 21 may be an estimate of an amount of energy used by the core 15 over a period of time which is equivalent to the fixed time sample interval.

Figure 3:
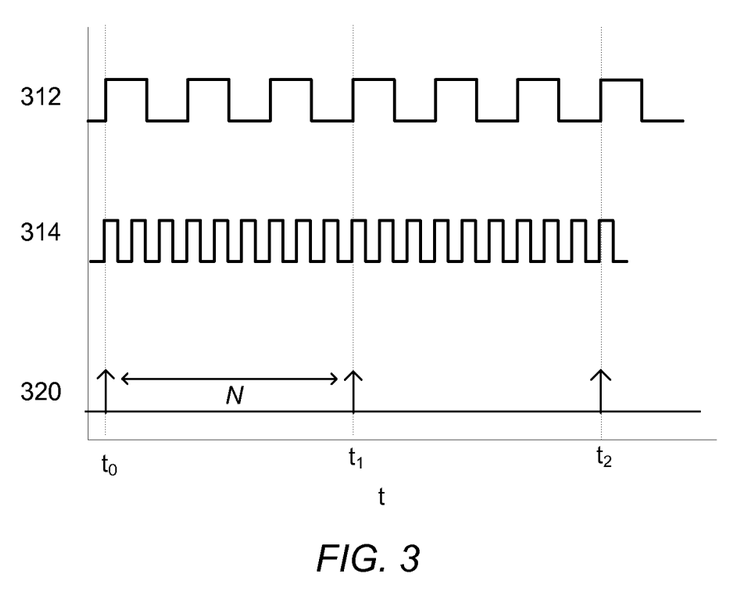
FIG. 3 is an example timing diagram which illustrates one embodiment of sampling, at a fixed time sample interval, cumulative energy values for two cores operating at different frequencies.

FIG. 3 is an example timing diagram which illustrates sampling, at a fixed time sample interval, cumulative energy values for two cores operating at different frequencies. For example, element 312 of FIG. 3 illustrates clock cycles for a core, (e.g., core 15A) operating at a lower frequency and element 314 of FIG. 3 illustrates clock cycles for a core (e.g., core 15B) operating at a higher frequency. Element 320 of FIG. 3 represents a fixed time sample interval at which a cumulative energy value for each core may be sampled. For example, $t_0$, $t_1$ and $t_2$, illustrate times at which the cumulative energy value for core 15A may be sampled.

As illustrated in FIG. 3, the time interval for sampling cumulative energy values, represented by N, may remain fixed. Further note that three clock cycles are executed by core 15A during fixed time sample interval N and that nine clock cycles are executed by core 15B during the same fixed time sample interval N. As an example, assume that power monitors 17A and 17B obtain energy values for cores 15A and 15B, respectively, once per operating clock cycle. In such an example, the cumulative energy value stored in register 19A may include a cumulative sum of three energy values and the cumulative energy value stored in register 19B may include a cumulative sum of nine energy values. Note that the cumulative energy value stored for a core over a period of time equivalent to the fixed time sample interval, N, is proportional to the operating frequency of the core.

By sampling the cumulative energy values of the cores at a fixed time sample interval, the power monitor 21 may inherently receive an estimate of power consumption which may be proportional to the operating frequencies of the cores 15. As described above in regard to equations 1 and 2, power monitor 21 may calculate an estimated dynamic power consumption for a core 15 using the sampled cumulative energy value. The operating frequency of a core may inherently be present in the dynamic power consumption estimate since the cumulative energy values are sampled by the power manager at a fixed time sample interval, and the capacitance C in equation 2 may increase linearly with the operating frequency. This fixed time sample interval sampling method may eliminate the use of complex math to scale the power estimates according to frequency. This method may also avoid using fuses in the integrated circuit to specify various operating frequencies, which may be a large number of potential operating frequencies and, thus, require a large amount of fuses. In addition, any changes in the operating frequencies of the cores, which are likely to occur within the fixed time sampling intervals, will be inherently reflected in the cumulative energy values stored by the cores.

To calculate a total power consumption estimate for the integrated circuit device, power manager 21 may repeat the calculation of an estimated dynamic power consumption value for each core 15 in processing node 12 in a manner similar to that described above. Power manager 21 may sum the calculated power consumption estimates for the multiple cores 15 to generate a total dynamic power consumption value for the integrated circuit device. Power manager 21 may add leakage values for multiple portions of the integrated circuit device to the dynamic power consumption value to calculate an overall power consumption estimate for the integrated circuit device.

The value, N, of the fixed time sample interval may be determined dependent on a number of factors. For example, the value of N may be chosen dependent on a number of samples obtained for a cumulative energy value for a particular core operating frequency. In such an example, the value of N may be set such that there are enough samples present in a cumulative energy value to represent an accurate power reading for a core. In some embodiments, a few hundred energy value samples may represent an accurate power reading for a core. Thus, N may be determined dependent on the operating frequencies and the energy value sample rates for the cores in a processor. More specifically, the value of N may be determined such that the core with the lowest operating frequency may have a long enough time between fixed time sample intervals to generate a cumulative energy value which includes enough samples to present an accurate power reading for the core. However, in addition to obtaining enough samples, responsiveness of the power manager 21 to changes in power consumption may also be considered when choosing an appropriate value of N.

More particularly, the value of N may also be chosen dependent on the thermal time constraints for the integrated circuit. Power manager 21 may sample cumulative energy values from a core and may accumulate power readings for the core in a power accumulator, which may be, for example, a storage location such as a register. Processor node 21 may have a target power consumption limit for a core 15. The target power consumption limit may be designed to prevent the core 15 from using an excessive amount of power and overheating. The target power consumption limit may also be used to determine when power headroom exists for the core 15 and the operating voltage and/or frequency of the core may be increased to speed up operation of the core.

Power manager 21 may subtract a power reading for a core from the target power consumption limit for the core and may store the resulting value in the power accumulator. The power accumulator may hold a negative value if a core is consistently operating below the target power consumption limit. At a certain negative threshold value in the power accumulator, power manager 21 may determine that a core 15 has available power headroom and, as a result, that the operating voltage and/or frequency for the core may be increased. As the power consumption of the core 15 increases, the value of the power accumulator may increase and may reach a certain positive threshold value. At the positive threshold value, power manager 21 may determine that the core 15 is above the target power consumption limit and may be in danger of overheating. As a result, the power manager 21 may decrease the operating voltage and/or frequency of the core 15 in order to decrease the power consumption of the core. Power manager 21 may use this described method to continually monitor and control the power consumption level for a core 15 in processing node 21.

The fixed time sample interval at which the power manager 21 samples the cumulative energy value for the core may determine how fast the power manager 21 is able to respond to changes in the power consumption of the core. Accordingly, the value of the time interval, N, may be selected such that the power manager 21 is able to quickly determine and respond to power consumption changes in a core 15. In some embodiments, the value of fixed time sample interval N may be obtained through empirical methods such as integrated circuit device characterization and testing. Thus, dependent on various operational and thermal constraints, the fixed time sample interval, N, may be any appropriate value. For example, in one embodiment, N may be several microseconds (e.g., four or five uS), while in other embodiments, N may be fewer or greater than several microseconds. Regardless of the actual value of N, the fixed time sample interval of may provide a good balance between obtaining an appropriate number of cumulative energy value samples and providing a fine granularity that may enable the system to respond quickly to changes in power consumption estimates.

The cumulative energy value accumulated by a power monitor 17 may have a wide range of values, depending on the length of the fixed time sample interval used by the power manager 21 and the operating frequency of the core 15. More specifically, for a long fixed time sample interval and/or a high sampling frequency, the power monitor 17 may accumulate a large cumulative energy value. The cumulative energy value accumulated by a power monitor 17 may be normalized to prevent overflow errors. For example, in one particular implementation, the accumulator of core 15 (e.g., register 19) may be a 32-bit accumulator. However, power manager 21 may be configured to receive an 8-bit value from a core 15. Accordingly, the 32-bit cumulative energy value may be normalized, or scaled down, to an 8 bit value. This normalization may result in a scaled range of cumulative energy values which is independent of the core operating frequency and energy value sample rate of the core 15. For an 8 bit value, for example, the scaled range of the cumulative energy value may range from a minimum of zero to maximum of 255.

A normalization factor may be determined for scaling the range of the cumulative energy values. The normalization factor may be dependent on the length of the fixed time sample interval and a potential maximum power consumption value for a core 15. For example, the maximum potential power consumption of the core 15 may be determined and may be measured for a length of time equivalent to the fixed time sample interval to determine a maximum value for the cumulative energy value of the core 15. As a specific example, at a fixed time sample interval of several microseconds and at maximum power consumption, the maximum cumulative energy value for the core 15 may be 10,000 energy counts. The 10,000 energy counts may overflow into bit 15 of the accumulator (e.g., register 19) of core 15. Accordingly, for a particular example, the normalization factor may be determined such that bits 15:7 of the core accumulator are used as an 8-bit cumulative energy value that may be read by the power manager 21. The normalization factor may be a floating point number which has a format as shown in equation 3.

$$F = M * 2^{(Exp-15)} \quad (3)$$

The exponent of the normalization factor selects the appropriate bit field of the accumulator register. More specifically, the exponent determines whether the 32 bit value is shifted left or right by a number of bits up to 16 bits. The normalization factor, F, of equation 3 may be determined by solving for values M and Exp, as shown in equations 4 and 5, respectively.

$$M = 1 \cdot (m_4 * 2^{-1} + m_3 * 2^{-2} + m_2 * 2^{-3} + m_1 * 2^{-4} + m_0 * 2^{-5}) \quad (4)$$

$$Exp = (e_4 * 2^4 + e_3 * 2^3 + e_2 * 2^2 + e_1 * 2^1 + e_0 * 2^0) \quad (5)$$

Variable M may represent the significand, or mantissa, of normalization factor F. As shown in equation 4, the high bit of significand M may be a value of 1. Accordingly, significand M may be a value within the range of 1.0 to 2.0 and may scale the value of the accumulator uniformly within a range of values from 0 to 255. The exponent, Exp, may extract the appropriate bits from the 32-bit accumulator. The 32-bit cumulative energy value for a core 15 may be represented as shown in equation 6.

$$Accum = A_{31} * 2^{16} + A_{30} * 2^{15} + \ldots + A_{15} * 2^0 + A_{14} * 2^{-1} + \ldots + A_0 * 1^{-15}) \quad (6)$$

The normalized 8-bit cumulative energy value for a core 15 may be calculated using the normalization factor, F, of equation 3 and the 32-bit cumulative energy value, Accum, of equation 6, as shown in equation 7.

$$EnergyCount[7:0] = int(Accum * F) \quad (7)$$

Figure 4:
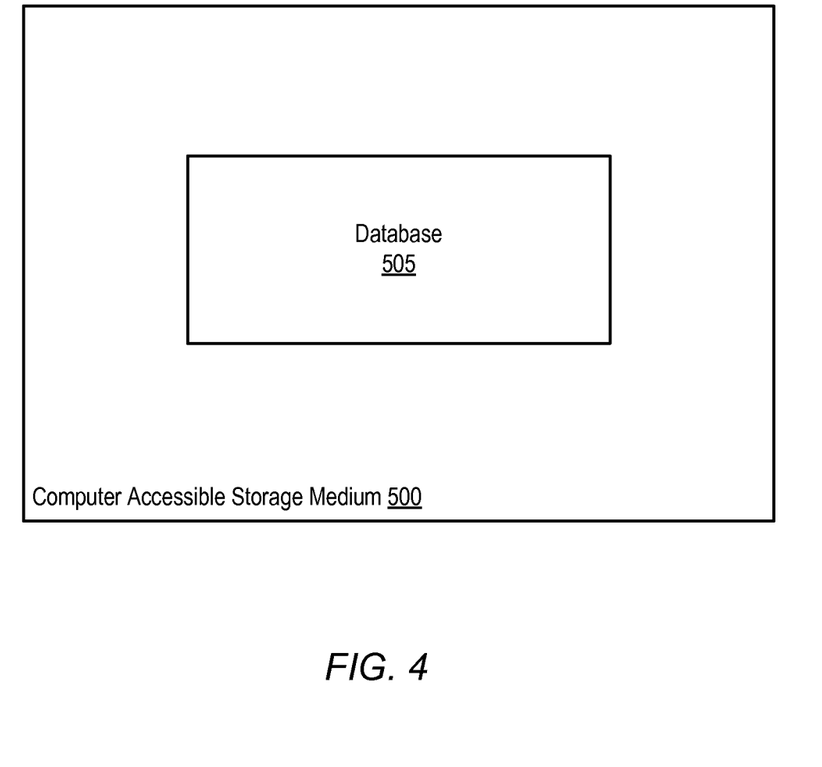
FIG. 4 is a block diagram of a computer accessible storage medium including a database representative of the processing node of FIG. 1.

Turning to FIG. 4, a block diagram of a computer accessible storage medium 500 including a database 505 representative of the processing node 12 of FIG. 1 is shown. Generally speaking, a computer accessible storage medium 500 may include any non-transitory storage media accessible by a computer during use to provide instructions and/or data to the computer. For example, a computer accessible storage medium 500 may include storage media such as magnetic or optical media, e.g., disk (fixed or removable), tape, CD-ROM, or DVD-ROM, CD-R, CD-RW, DVD-R, DVD-RW, or Blu-Ray. Storage media may further include volatile or non-volatile memory media such as RAM (e.g. synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media may include micro-electromechanical systems (MEMS), as well as storage media accessible via a communication medium such as a network and/or a wireless link.

Generally, the database 505 of the processing node 12 carried on the computer accessible storage medium 500 may be a database or other data structure which can be read by a program and used, directly or indirectly, to fabricate the hardware comprising the processing node 12. For example, the database 505 may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates from a synthesis library. The netlist comprises a set of gates which also represent the functionality of the hardware comprising the processing node 12. The netlist may then be placed and routed to produce a data set describing geometric shapes to be applied to masks. The masks may then be used in various semiconductor fabrication steps to produce a semiconductor circuit or circuits corresponding to the processing node 12. Alternatively, the database 505 on the computer accessible storage medium 500 may be the netlist (with or without the synthesis library) or the data set, as desired.

While the computer accessible storage medium 500 carries a representation of the processing node 12, other embodiments may carry a representation of any portion of the processing node 12, as desired.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A method comprising:
obtaining, by a power monitor of an integrated circuit device, an energy value for at least a portion of the integrated circuit device, wherein the energy value corresponds to an amount of energy used by the at least a portion of the integrated circuit device during operation;
generating, by the power monitor of the integrated circuit device, a cumulative energy value for the at least a portion of the integrated circuit device by repeatedly obtaining energy values, wherein the cumulative energy value is based upon the obtained energy values; and
sampling the cumulative energy value at a time sample interval, wherein each sample of the cumulative energy value corresponds to an estimate of an amount of energy used by the at least a portion of the integrated circuit device during the time sample interval.

2. The method as recited in claim 1, wherein said repeating is performed at a sampling frequency that is proportional to an operating frequency of the at least a portion of the integrated circuit device.

3. The method as recited in claim 2, wherein the operating frequency of the at least a portion of the integrated circuit device changes during the time sample interval.

4. The method as recited in claim 1, wherein said sampling the cumulative energy value further comprises resetting the cumulative energy value subsequent to said sampling.

5. The method as recited in claim 1, wherein the time sample interval is dependent on a number of energy samples obtained for the cumulative energy value and a thermal time constraint for the integrated circuit device.

6. The method as recited in claim 1, further comprising calculating an estimated amount of power consumed by the at least a portion of the integrated circuit device by dividing a sample of the cumulative energy value by the time sample interval.

7. The method as recited in claim 6, further comprising calculating a power consumption estimate for the integrated circuit device by:
    repeating, for a plurality of portions of the integrated circuit device, said calculating an estimated amount of power consumed;
    summing the calculated power consumption estimates for the plurality of portions of the integrated circuit device to generate a dynamic power consumption value for the integrated circuit device; and
    adding a plurality of leakage values to the dynamic power consumption value to calculate the power consumption estimate for the integrated circuit device.

8. A non-transitory computer readable medium storing a data structure which is operated upon by a program executable on a computer system, the program operating on the data structure to perform a portion of a process to fabricate an integrated circuit including circuitry described by the data structure, the circuitry described in the data structure including:
    a plurality of processor cores, wherein each one of the plurality of processor cores comprises a respective power monitor configured to:
        obtain an energy value for at least a portion of an integrated circuit device, wherein the energy value corresponds to an amount of energy used by the at least a portion of the integrated circuit device during operation; and
        generate a cumulative energy value for the at least a portion of the integrated circuit device by repeatedly obtaining energy values, wherein the cumulative energy value is based upon the obtained energy values; and
    a power management unit coupled to the plurality of processor cores and configured to:
        sample the cumulative energy value at a time sample interval, wherein each sample of the cumulative energy value corresponds to an estimate of an amount of energy used by the at least a portion of the integrated circuit device during the time sample interval.

9. The non-transitory computer readable storage medium as recited in claim 8, wherein said repeating is performed at a sampling frequency that is proportional to an operating frequency of the at least a portion of the integrated circuit device.

10. The non-transitory computer readable storage medium as recited in claim 8, wherein the operating frequency of the at least a portion of the integrated circuit device changes during the time sample interval.

11. The non-transitory computer readable storage medium as recited in claim 8, wherein the power management unit is further configured to reset the cumulative energy value subsequent to said sampling the cumulative energy value.

12. The non-transitory computer readable storage medium as recited in claim 8, wherein the time sample interval is dependent on a number of energy samples obtained for the cumulative energy value and a thermal time constraint for the integrated circuit device.

13. The non-transitory computer readable storage medium as recited in claim 8, wherein the power management unit is further configured to divide a sample of the cumulative energy value by the time sample interval to calculate an estimated amount of power consumed by the at least a portion of the integrated circuit device.

14. The non-transitory computer readable storage medium as recited in claim 13, wherein the power management unit is further configured to:
    repeatedly calculate the estimated amount of power consumed for a plurality of portions of the integrated circuit device;
    sum the calculated power consumption estimates for the plurality of portions of the integrated circuit device to generate a dynamic power consumption value for the integrated circuit device; and
    add a plurality of leakage values to the dynamic power consumption value to calculate a power consumption estimate for the integrated circuit device.

15. A system comprising:
    a plurality of processor cores, wherein each one of the plurality of processor cores comprises a respective power monitor configured to:
        obtain an energy value for a respective processor core, wherein the energy value corresponds to an amount of energy used by the processor core during operation; and
        generate a cumulative energy value for the processor core by repeatedly obtaining energy values, wherein the cumulative energy value is based upon the obtained energy values; and
    a power management unit coupled to the plurality of processor cores and configured to:
        sample the cumulative energy value at a time sample interval, wherein each sample of the cumulative energy value corresponds to an estimate of an amount of energy used by the processor core during the time sample interval.

16. The system as recited in claim 15, wherein said repeating is performed at a sampling frequency that is proportional to an operating frequency of the at least a portion of the integrated circuit device.

17. The system as recited in claim 15, wherein the power management unit is further configured to reset the cumulative energy value subsequent to said sampling the cumulative energy value.

18. The system as recited in claim 15, wherein the time sample interval is dependent on a number of energy samples obtained for the cumulative energy value and a thermal time constraint for the integrated circuit device.

19. The system as recited in claim 15, wherein the power management unit is further configured to divide a sample of the cumulative energy value by the time sample interval to calculate an estimated amount of power consumed by the at least a portion of the integrated circuit device.

20. The system as recited in claim 19, wherein the power management unit is further configured to:
    repeatedly calculate the estimated amount of power consumed for a plurality of portions of the integrated circuit device;
    sum the calculated power consumption estimates for the plurality of portions of the integrated circuit device to generate a dynamic power consumption value for the integrated circuit device; and add a plurality of leakage values to the dynamic power consumption value to calculate a power consumption estimate for the integrated circuit device.

\* \* \* \* \*